United States Patent
Jung

(10) Patent No.: US 11,531,364 B1
(45) Date of Patent: Dec. 20, 2022

(54) APPARATUS AND METHOD FOR STABILIZING POWER IN A SEMICONDUCTOR DEVICE

(71) Applicant: SK hynix Inc., Gyeonggi-do (KR)

(72) Inventor: Jong Seok Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/500,399

(22) Filed: Oct. 13, 2021

(30) Foreign Application Priority Data

Jun. 3, 2021 (KR) .................. 10-2021-0072139

(51) Int. Cl.
| | | |
|---|---|---|
| G05F 1/575 | (2006.01) | |
| G11C 5/14 | (2006.01) | |
| H03M 13/00 | (2006.01) | |
| H03M 13/11 | (2006.01) | |

(52) U.S. Cl.
CPC .............. *G05F 1/575* (2013.01); *G11C 5/147* (2013.01); *H03M 13/1102* (2013.01); *H03M 13/616* (2013.01)

(58) Field of Classification Search
None
See application file for complete search history.

(56) References Cited

U.S. PATENT DOCUMENTS

| | | | | |
|---|---|---|---|---|
| 5,726,563 A | * | 3/1998 | Bolton, Jr. ............. | G05F 3/267 323/315 |
| 6,229,373 B1 | * | 5/2001 | Ng ..................... | H03F 3/45479 326/62 |
| 6,927,557 B2 | * | 8/2005 | Proll .................... | G05F 1/465 327/539 |
| 7,786,790 B2 | * | 8/2010 | Yoshida ............... | G01C 19/56 327/539 |
| 8,928,305 B2 | * | 1/2015 | Ueunten .............. | H02M 3/158 323/313 |
| 2009/0212752 A1 | * | 8/2009 | Hoshino ............... | G05F 1/575 323/274 |
| 2020/0273528 A1 | | 8/2020 | Na et al. | |

* cited by examiner

*Primary Examiner* — Thomas J. Hiltunen
(74) *Attorney, Agent, or Firm* — IP&T Group LLP

(57) ABSTRACT

A power generation device includes a band gap reference (BGR) circuit configured to generate a reference voltage independent of an environmental change, and a voltage generation circuit configured to transfer an input power voltage based on a sum of the reference voltage and an internal ground voltage to generate an internal power voltage.

20 Claims, 8 Drawing Sheets

APPARATUS AND METHOD FOR STABILIZING POWER IN A SEMICONDUCTOR DEVICE

CROSS-REFERENCE TO RELATED APPLICATIONS

This patent application claims the benefit to Korean Patent Application No. 10-2021-0072139, filed on Jun. 3, 2021, the entire disclosure of which is incorporated herein by reference.

TECHNICAL FIELD

Various embodiments of the present disclosure described herein relate to a semiconductor device, and particularly relate to an apparatus and method for monitoring supply power in the semiconductor device.

BACKGROUND

A semiconductor device includes a device for efficiently controlling and managing power supplied externally. The semiconductor device may include at least one regulator. The regulator may be designed to generate a constant or stable voltage and supply the constant or stable voltage to loads included in the semiconductor device. When the power supplied externally is unstable or the loads inside the semiconductor device are excessive, a voltage output from the regulator may drop or fluctuate. When the regulator included in the semiconductor device supplies or outputs a stable power voltage, plural internal circuits in the semiconductor device may operate stably.

BRIEF DESCRIPTION OF THE DRAWINGS

The description herein makes reference to the accompanying drawings wherein like reference numerals refer to like parts throughout the figures.

DETAILED DESCRIPTION

Figure 1:
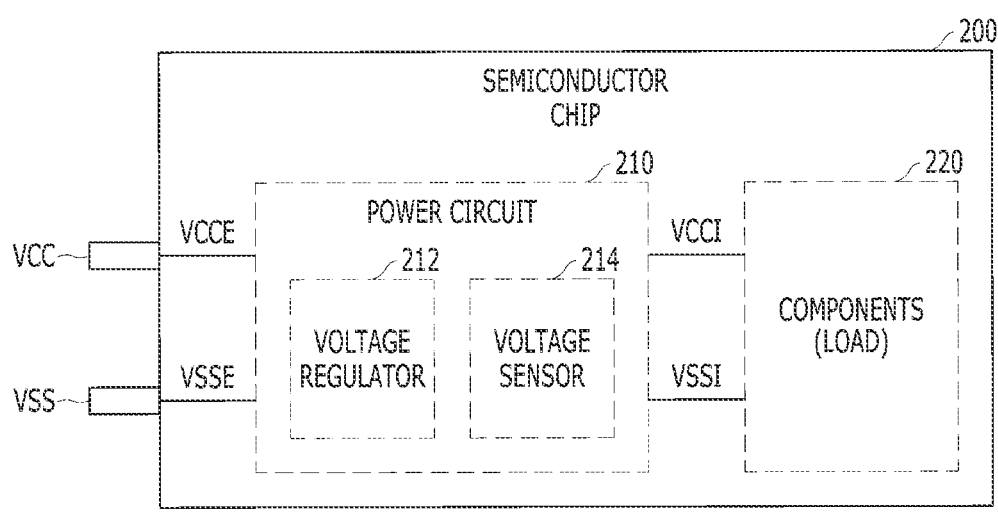
FIG. 1 illustrates a semiconductor device chip according to an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor (s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

An embodiment of the present disclosure can provide an apparatus and method capable of efficiently managing power inside a semiconductor device.

In a semiconductor chip, power supplied to the semiconductor device may be unstable, a load may be excessive, an overcurrent occurs, or a ground voltage may fluctuate, because of an internal operation or an internal design/structure of the semiconductor chip. According to an embodiment of the present invention, it is possible to provide an apparatus and method capable of compensating for variations in the ground voltage to stabilize a power voltage supplied into an internal circuit of the semiconductor chip.

The semiconductor device may include a voltage regulator or an internal voltage generator configured to generate a power voltage, supplied into a component, to compensate for a design of a component and an operation performed thereby. The voltage regulator or the internal voltage generator may include, or be connected to, a band gap reference (BGR) circuit. A reference voltage output from the band gap reference (BGR) circuit may be kept constant. However, the ground voltage may be changed or fluctuated at a specific location inside the semiconductor device. The voltage regulator or the internal voltage generator may include an adder circuit capable of tracking a change of the ground voltage, adding a tracked level to the output of the bandgap reference (BGR) circuit, and output an added level. The output of the band gap reference (BGR) circuit with the adder circuit is input to the voltage regulator and the internal voltage generator, to improve stability of an internal power voltage output from the voltage regulator and the internal voltage generator.

In the semiconductor device, supplied power may be practically determined based on a difference between an internal power voltage and an internal ground voltage. The voltage regulator or the internal voltage generator which generates an internal power voltage used for an operation performed inside the semiconductor device can generate an internal power voltage having a level adjusted in response to a voltage level that is changed in real time under an internal operating environment, so that the internal power voltage generated by the voltage regulator or the internal voltage generator may be supplied without a significant difference even inside the semiconductor device.

In an embodiment, a power generation device can include a band gap reference (BGR) circuit configured to generate a reference voltage independent of an environmental change; and a voltage generation circuit configured to transfer an input power voltage based on a sum of the reference voltage and an internal ground voltage to generate an internal power voltage.

The voltage generation circuit can include an adder circuit configured to add the reference voltage and the internal ground voltage; and at least one of a pass circuit configured to transfer the input power voltage in response to an output of the adder circuit to output the internal power voltage or a regulator configured to change a level of the input power voltage in response to the output of the adder circuit to output the internal power voltage.

The voltage generation circuit can further include a feedback circuit configured to divide an output of the pass circuit by a preset ratio to generate a feedback voltage.

The adder circuit can include an input circuit configured to generate a first current corresponding to a value of multiplying a first difference between the reference voltage output from the band gap reference circuit and the feedback voltage by a first gain and a second current corresponding to another value of multiplying a second difference between the internal ground voltage and a reference ground voltage by a second gain; and an output circuit configured to output an output voltage in response to the first current and the second current.

The adder circuit can control a compensation degree for a change of the internal ground voltage based on a ratio of the first gain and the second gain.

The voltage generation circuit can include an adder circuit configured to receive the input power voltage and output the internal power voltage in response to the sum of the reference voltage and the internal ground voltage; and a feedback circuit configured to divide an output of the adder circuit by a preset ratio to generate a feedback voltage.

The adder circuit can include an input circuit configured to generate a first current corresponding to a value of multiplying a first difference between the reference voltage output from the band gap reference circuit and the feedback voltage by a first gain, and a second current corresponding to another value of multiplying a second difference between the internal ground voltage and a reference ground voltage by a second gain; and an output circuit configured to output an output voltage in response to the first current and the second current.

According to an embodiment, the adder circuit can be designed to have a different compensation degree for a change of the internal ground voltage based on a ratio of the first gain and the second gain.

In another embodiment, a power circuit can include a voltage sensor configured to sense an internal ground voltage; and a power generation device configured to transfer an input power voltage based on a sum of the internal ground voltage and a reference voltage, which is independent of an environmental change, to generate an internal power voltage.

The power generation device can include a band gap reference (BGR) circuit configured to generate the reference voltage; and a voltage generation circuit configured to transfer the input power voltage based on the sum of the reference voltage and the internal ground voltage to generate the internal power voltage.

In another embodiment, a semiconductor device can include a pin or a pad, an internal circuit, and a voltage generating device which is coupled to the pin, or the pad, and the internal circuit and configured to transfer an input power voltage based on a sum of a reference voltage, which is independent of an environmental change, and an internal ground voltage to generate an internal power voltage.

The voltage generating device can include a band gap reference (BGR) circuit configured to generate the reference voltage; and a voltage generator configured to transfer the input power voltage based on the sum of the reference voltage and the internal ground voltage to generate the internal power voltage.

The voltage generator can include an adder circuit configured to add the reference voltage and the internal ground voltage; and a pass circuit configured to transfer the input power voltage in response to an output of the adder circuit to output the internal power voltage.

In another embodiment, a power generating circuit can include a first circuit configured to generate an adjusted reference voltage by adding, to a fixed reference voltage, an adjusting voltage amounting to deviation from a target ground voltage; and a second circuit configured to generate an internal power voltage by adjusting an external power voltage and configured to generate a feedback voltage from the internal power voltage.

The second circuit can adjust the external power voltage based on a difference between the adjusted reference voltage and the feedback voltage.

Embodiments of the present disclosure will now be described with reference to the accompanying drawings, wherein like numbers reference like elements.

FIG. 1 illustrates a semiconductor device chip according to an embodiment of the present disclosure.

Referring to FIG. 1, a semiconductor device chip 200 can include electrical elements and circuits to perform a specific function. The semiconductor device chip 200 can include a plurality of pins or pads, and can receive or output a power voltage, a data item, a command, or various control signals through the plurality of pins or pads. The circuits or electrical elements included in the semiconductor device chip 200 may vary depending on a design purpose, and the number of a plurality of pins or pads included in the semiconductor device chip may also vary depending on a design.

The plurality of pins or pads may be used according to a preset function or purpose. For example, when a specific pin or pad among the plurality of pins or pads is set to be used for data input/output, an electrical signal corresponding to the data item (e.g., a waveform or a potential within a specific voltage range) is transmitted to the corresponding pin or pad. Also, when a power voltage is supplied to a specific pin or pad, the specific pin or pad may be used to receive a power voltage used for operation of internal components included in the semiconductor device chip.

A semiconductor device such as a memory system or a processor which satisfies a user's needs has been developed to operate at a higher speed and consume less power. The semiconductor device chip 200 can include plural circuits or modules to perform various functions. When a plurality of circuits, modules, or components that perform a plurality of functions are formed in plural different semiconductor chips, delay and noise may occur in the process of transferring data and signals between circuits, modules or components of the plural different semiconductor chips, so that operation performance of the memory system or the processor may be degraded. Recently, the semiconductor device chip 200 may be designed to include various circuits, modules, or components, thereby improving performance of the semiconductor device and increasing an integration degree of the semiconductor device.

As a plurality of circuits, modules, or components are included in the single semiconductor device chip 200, a change of electrical loads inside the semiconductor device chip 200 may increase. Referring to FIG. 1, a power voltage VCC and a ground voltage VSS may be supplied through a plurality of pins or pads included in the semiconductor device chip to operate the plurality of circuits, modules, or components included in the semiconductor device chip 200. The semiconductor device chip 200 can include a power circuit 210 that outputs an internal power voltage VCCI and an internal ground voltage VSSI, and a component 220 driven by the internal power voltage VCCI and the internal ground voltage VSSI. The power circuit 210 can generate the internal power voltage VCCI and the internal ground voltage VSSI based on an external power voltage VCCE and an external ground voltage VSSE supplied through at least one pin or pad.

For example, the power circuit 210 can include a voltage regulator 212 and a voltage sensor 214. The voltage regulator 212 can be used to supply stable power to an electronic device such as the memory system 110. Generally, the voltage regulator 212 may be classified into a linear regulator and a switching regulator. An example of the switching regulator can be a DC-DC converter. Although the DC-DC converter can have high conversion efficiency, the output voltage of the DC-DC converter may include a lot of noise compared to that of the linear regulator. An example of a linear regulator can be a low-dropout (LDO) regulator. The LDO regulator may have low conversion efficiency. But, the LDO regulator can have a fast response speed. In addition, the output voltage of the LDO regulator can include a smaller amount of noise compared to that of the DC-DC converter. Generally, the LDO regulator can be applicable to a noise-sensitive device or a device which should be driven with high performance.

For example, the LDO regulator, which can compensate for the disadvantages of the DC-DC converter, can be applicable to the memory system 110 operating at a high speed. The voltage regulator 212 can output the internal power voltage VCCI based on the external power voltage VCCE.

Figure 2:
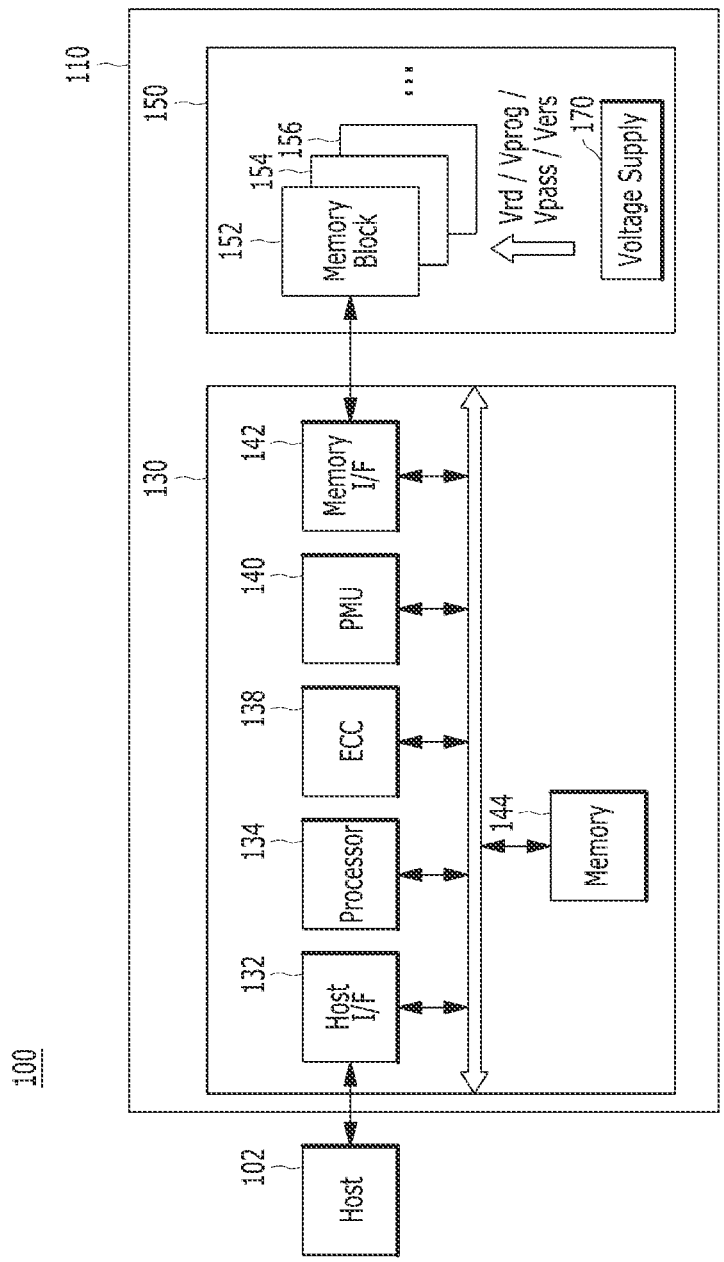
FIG. 2 illustrates a data processing system according to an embodiment of the present disclosure.

According to an embodiment, the component 220 described in FIG. 1 can include plural memory blocks 152, 154, 156 and a voltage supply circuit 170 described in FIG. 2. According to an operation performed through the memory blocks 152, 154, 156 and the voltage supply circuit 170, electrical loads of the component 220 may vary. Further, according to an embodiment, the component 220 can include at least one module or circuit included in the controller 130. When an overload or an overcurrent occur due to a structure or an operation of the component 220, a change of the internal power voltage VCCI or the internal ground voltage VSSI can occur.

The voltage sensor 214 may detect a change of the internal power voltage VCCI or the internal ground voltage VSSI. Due to the operation of the component 220, a phenomenon in which the internal ground voltage VCCI is changed or fluctuated at a specific position inside the semiconductor device chip 200 may occur. The power supplied into the component 220 may be determined based on a voltage difference between the internal ground voltage VSSI and the internal power voltage VCCI. However, when the internal ground voltage VSSI is not maintained at a level of 0V but is fluctuated or changed in a range of −500 mV to 500 mV or more, the power supplied into the component 220 may exceeds a preset range.

When the voltage regulator 212 generates the internal power voltage VCCI regardless of fluctuation of the internal ground voltage VSSI, a level of the internal power voltage VCCI, which is even appropriately output from the voltage regulator 212, might not be supplied with the preset range into the component 220. For example, when the voltage regulator 212 outputs the internal power voltage VCCI of 5V based on the external ground voltage VSSE but the internal ground voltage VSSI becomes 1V, the power supplied into the component 220 is a voltage of 4V based on the voltage difference between the internal power voltage VCCI and the internal ground voltage VSSI. Substantially, when a voltage of 4V is supplied into the component 220 of the semiconductor device chip 200, an operation of the component 220 may become unstable.

The voltage regulator 212 according to an embodiment of the present invention may generate the internal power voltage VCCI in response to the internal ground voltage VSSI. For example, the voltage regulator 212 can output the internal power voltage VCCI based on a sum of a reference voltage Vref (refer to FIG. 3), which is independent from a change of the external power voltage VCCE, and the internal ground voltage VSSI which is fluctuated or changed environmentally by the component 220. Herein, an environmental change may include a change of a process, a voltage, and a temperature (e.g., Process-Voltage-Temperature (PVT) variations) inside the semiconductor device chip 220. For example, the voltage regulator 212 may include an adder circuit capable of summing the reference voltage Vref and the internal ground voltage VSSI. In a process of outputting the internal power voltage VCCI based on the sum of the reference voltage Vref and the internal ground voltage VSSI, the voltage regulator 212 can track a change of the internal ground voltage VSSI and stably supply the internal power voltage VCCI into the component 220.

According to an embodiment, an apparatus such as the power circuit may be applicable to a non-volatile memory device or a memory system including a non-volatile memory device. Also, according to another embodiment, the power circuit may be applicable to a volatile memory device or a memory system including the volatile memory device. The power circuit may also be applicable to a processor, a system IC, or the like which is designed for a specific purpose. Hereinafter, referring to FIGS. 1 and 2, a memory system implemented in a semiconductor device chip including a power circuit according to an embodiment will be described.

FIG. 2 illustrates a data processing system according to an embodiment of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like, to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single semiconductor device chip 200 shown in FIG. 1 or a plurality of semiconductor device chips. According to an embodiment, when the memory system 110 may be required to have a higher integration degree, the memory device 150 and the controller 130 may be included in the single semiconductor device chip 200. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIG. 2 may be different according to performance of the memory system 110. An embodiment of the present disclosure is not limited to the internal configuration shown in FIG. 2.

Referring to FIG. 2, the memory device 150 may include a voltage supply circuit 170 capable of supplying at least some voltage into the memory block 152, 154, 156. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected nonvolatile memory cell, the voltage supply circuit 170 may supply a pass voltage Vpass into a non-selected nonvolatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The voltage supply circuit 170 in the memory device 150 can generate plural voltages having various levels based on the power supply voltage VCC. In this operation, an amount of electrical load may be increased or decreased. For example, when a high-level voltage such as the program voltage Vprog is repeatedly generated and used in the memory device 150, an electrical load may rapidly increase so that a temporary drop of the power voltage VCC may occur. Referring to FIGS. 1 and 2, the power circuit 210 in the semiconductor device chip 200 may detect a drop of the power voltage VCC and output a detection result to the controller 130.

The host 102 may include a portable electronic device (e.g., a mobile phone, an MP3 player, a laptop computer, etc.) or a non-portable electronic device (e.g., a desktop computer, a game player, a television, a projector, etc.).

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to an implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102. For example, the host 102 and the memory system 110 may use a predetermined protocol to transmit and receive data therebetween. Examples of a set of rules or procedures for data communication or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate, and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support a connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes.

For example, the ECC decoder may perform hard decision decoding or soft decision decoding on data transmitted from the memory device 150.

The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then performs a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. Compared to the hard decision decoding in which a value output from a non-volatile memory cell is coded as 0 or 1, the soft decision decoding can determine the value stored in the non-volatile memory cell based on the stochastic information. Regarding bit-flipping which may be considered an error that can occur in the memory device 150, the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code for example, a Hamming code, in two or three dimensions and repeat decoding in a row direction and a column direction to improve the reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

According to an embodiment, the PMU 140 may receive the detection result about the drop of the power supply voltage from the power circuit 210 included in the semiconductor device chip described with reference to FIGS. 1 and 4. The PMU 140 may check a safety of operations performed in the memory system 110, in response to the detection result.

In addition, according to an embodiment, the PMU 140 may temporarily stop an operation of the memory system 110 in response to the detection result, or may cause an operation to be performed again when safety or integrity of the operation is suspected.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. As a background operation that is performed without a command transmitted from the host 102, the controller 130 can perform garbage collection (GC), wear leveling (WL), bad block management for identifying and processing bad blocks, or the like.

According an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform a parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In one embodiment, each memory block 152, 154, or 156 may have a three-dimensional stack structure for a high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates a memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in a view of storage capacity.

In an embodiment, the memory device 150 may be implemented with MLC memory blocks such as a double level cell (DLC) memory block, a triple-level cell (TLC) memory block, a quadruple-level cell (QLC) memory block, or a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use a MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

Further, according to an embodiment, the controller 130 can program data in a MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in a MLC. According to an embodiment, an operation for uniformly levelling threshold voltages of the MLCs may be carried out before another 1-bit data is programmed in the same MLCs, each having stored another 1-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (STT-RAM), and a spin transfer torque magnetic random access memory (STT-MRAM), or the like.

Figure 3:
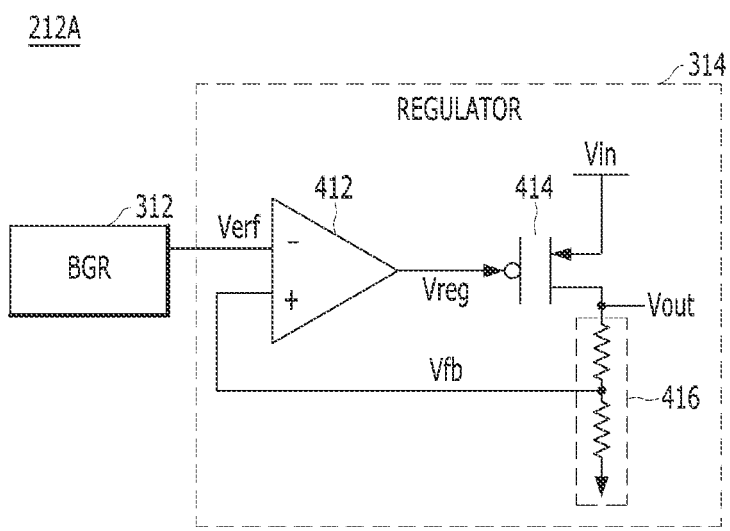
FIG. 3 illustrates a voltage generating device.

FIG. 3 illustrates a voltage generating device. The voltage generating device 212A illustrated in FIG. 3 will be described as an example of the voltage regulator 212 shown in FIG. 1. The voltage generating device 212A may include a low dropout (LDO) linear regulator.

For example, the low dropout (LDO) linear regulators can regulate a power voltage from a higher voltage input in various ways to output the regulated power voltage. The low dropout (LDO) linear regulator is a linear regulator whose output voltage has a lower level than an input voltage. The low dropout (LDO) linear regulator can eliminate an effect of ripples on the input voltage to output an accurate internal power voltage Vout. Here, the internal power voltage Vout may be substantially the same as the internal power voltage VCCI described with reference to FIG. 1.

The low dropout (LDO) linear regulator may include a band gap reference (BGR) circuit 312 and a voltage generation circuit 314. For example, the band gap reference (BGR) circuit 312 may generate a constant reference voltage Vref independent from an environmental change inside the semiconductor device chip 200. The environmental change can include a change of a process, a voltage, and a temperature (Process-Voltage-Temperature (PVT) variations) in the semiconductor device chip 220. For example, a degree to which the reference voltage Vref changes according to a change of a process, a voltage, and a temperature (Process-Voltage-Temperature, PVT) may be determined based on precision or performance of the band gap reference (BGR) circuit 312. For example, the reference voltage Vref output from the band gap reference (BGR) circuit 312 may have a variation range of 3 to 5% or less in response to changes of the process, the voltage, and the temperature PVT.

The voltage generation circuit 314 may include an error amplifier 412 and a pass device 414. The error amplifier 412 may compare the reference voltage Vref output from the band gap reference (BGR) circuit 312 with a feedback voltage Vfb to output a comparison result Vreg. For example, the error amplifier 412 may include a high gain amplifier.

The pass device 414 may transfer an input voltage Vin to the internal power voltage Vout, in response to an output of the error amplifier 412. Herein, the input voltage Vin may be the external power voltage VCCE described with reference to FIG. 1. For example, as the internal power voltage Vout, which is an output of the pass device 414, increases according to changes of the process, the voltage, and the temperature (PVT), the feedback voltage Vfb may increase. When the feedback voltage Vfb increases, a comparison result Vref output from the error amplifier 412 may also increase. In this case, a level of a current flowing through the pass device 414 may decrease, so that a level of the internal power voltage Vout output from the pass device 414 may decrease.

Moreover, when the internal power voltage Vout, which is the output of the pass device 414, decreases according to changes of the process, the voltage, and the temperature (PVT), the feedback voltage Vfb may decrease. When the feedback voltage Vfb decreases, the comparison result Vref output from the error amplifier 412 may also decrease. In this case, a level of the current flowing through the pass device 414 may increase, and a level of the internal power voltage Vout output from the pass device 414 may increase.

In a process for generating the internal power voltage Vout based on the external power voltage VCCE, a voltage drop can be occurred by the pass device 414 included in the voltage generation circuit 314. This voltage drop can be considered a low dropout (LDO).

The voltage generation circuit 314 can further include a feedback circuit 416 configured to divide the output of the pass device 414 by a preset ratio to generate a feedback voltage Vfb. For example, the feedback circuit 416 may generate the feedback voltage Vfb by dividing the internal power voltage Vout, which is an output of the pass device 414 including a plurality of resistors, by a resistance ratio between the plurality of resistors.

The voltage generating device 212A illustrated in FIG. 3 may adjust the internal power voltage Vout in response to a change of the process, the voltage, or the temperature (PVT). However, as described with reference to FIG. 1, an overload or an overcurrent may occur due to internal structure/design or operation of the component 220, so that a level of the internal ground voltage VSSI may be changed or fluctuated. Even if the internal power voltage Vout is appropriately output through the voltage generating device 212A, the internal power voltage Vout in the component 220 may be used based on a changed level of internal ground voltage VSSI. Accordingly, when the level of the internal ground voltage VSSI fluctuates, an internal operation of the component 220 supplied with the internal power supply voltage Vout that is the output of the voltage generating device 212A may become unstable. Accordingly, the voltage generating device 212A can generate the internal power voltage Vout in response to a level of the internal ground voltage VSSI.

Figure 4A:
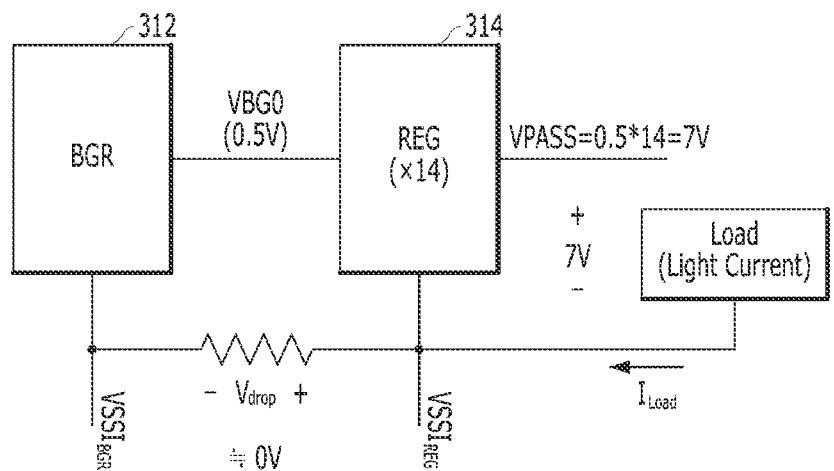
FIGS. 4A and 4B illustrate an operation of a voltage generating device in response to a change of an internal ground voltage according to an embodiment of the present disclosure.
Figure 4B:
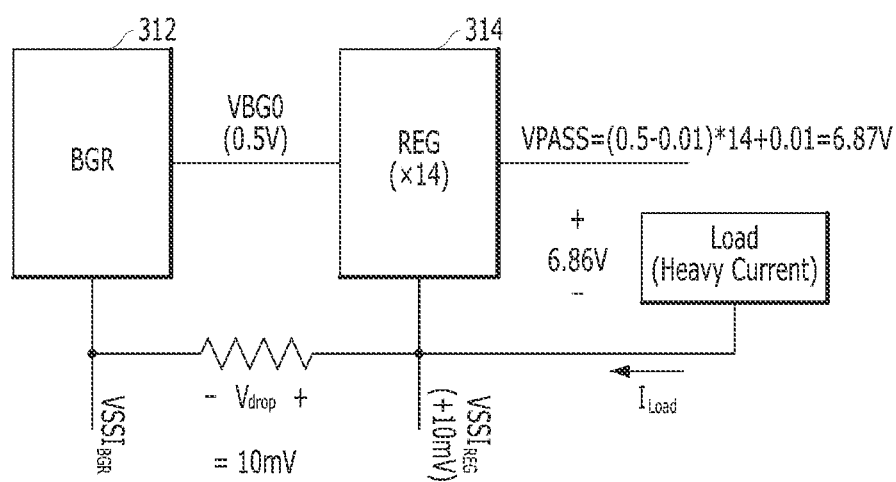

FIGS. 4A and 4B illustrate an operation of the voltage generating device in response to a change of an internal power voltage according to an embodiment of the present disclosure. The voltage generating device can generate an internal power voltage or an internal operating voltage, having various levels, used for an operation performed by the memory system 110 or the component 220 included in the semiconductor device chip 200. For example, the voltage generating device can include the band gap reference (BGR) circuit 312 and the voltage generation circuit 314 shown with reference to FIG. 3. Specifically, FIG. 4A describes the internal power voltage output from the voltage generating device when there is no change of the internal ground voltage VSSI. FIG. 4B describes the internal power voltage output from the voltage generating device when there is a change of the internal ground voltage VSSI.

Referring to FIG. 4A, when a current $I_{Load}$ flowing through a load in the semiconductor device does not deviate from a preset estimated range ("Light Current"), the internal ground voltage $VSSI_{REG}$, $VSSI_{BGR}$ applied to the band gap reference (BGR) circuit 312 and the voltage generation circuit 314 of the voltage generating device might be not changed or fluctuated by the current $I_{Load}$ flowing through the load. The band gap reference (BGR) circuit 312 may generate a reference voltage VBG0 independent from a change of the process, the voltage, or the temperature (PVT). However, a pass voltage VPASS output from the voltage generation circuit 314 receiving the reference voltage VBG0 may be determined based on a voltage level difference from the internal ground voltage $VSSI_REC$.

For example, when the band gap reference (BGR) circuit 312 outputs a reference voltage VBG0 of 0.5 V independent from the change of the process, the voltage, or the temperature (PVT), the voltage generation circuit 314 can generate a pass voltage (VPASS) of 7V which is 14 times the reference voltage VBG0 of 0.5 V. When the internal ground voltage $VSSI_{REG}$ is not changed or fluctuated (i.e., has a constant level of 0V), the pass voltage VPASS of 7V may be supplied into the component 220 included in the semiconductor device chip 200. The component 220 included in the semiconductor device chip 200 can use the pass voltage VPASS of 7V to perform an operation.

Referring to FIG. 4B, when the current $I_{Load}$ flowing through the load in the semiconductor device deviates from the preset estimated range ("Heavy Current"), the internal ground voltage $VSSI_{REG}$, $VSSI_BGR$ applied to the band gap reference (BGR) circuit 312 and the voltage generation circuit 314 of the voltage generating device might be changed or fluctuated by the current $I_{Load}$ flowing through the load. For example, a level of the internal ground voltage $VSSI_{REG}$ is changed to 0.01V (10 mV) from 0V. The bandgap reference (BGR) circuit 312 can generate the reference voltage VBG0 independent from the change of the process, the voltage, or the temperature (PVT). However, the pass voltage VPASS output from the voltage generation circuit 314 that receives the reference voltage VBG0 can be determined based on the voltage level different from the internal ground voltage $VSSI_{REG}$.

Although the band gap reference (BGR) circuit 312 outputs the reference voltage VBG0 of 0.5 V independent from the change of the process, the voltage, or the temperature (PVT), the voltage generation circuit 314 can generate and output the pass voltage VPASS based on the voltage level difference of 0.49V, not 0.5V, which is a difference between the reference voltage VBG0 of 0.5 V and the internal ground voltage $VSSI_{REG}$ of 0.01V. For example, a pass voltage VPASS of 6.86V, which is 14 times 0.49V, can be generated based on the internal ground voltage $VSSI_{REG}$ of 0.01V. The voltage generating device can output the pass voltage VPASS of 6.87V, not 7V. A case when the current $I_{Load}$ flowing through the load of the semiconductor device chip 200 deviates from the estimated range (Heavy Current) can often occur sectionally, not entirely, in the semiconductor device chip 200. When the pass voltage VPASS of 6.87V is supplied into the component 220 included in the semiconductor device chip 200, the pass voltage of 6.87V can be supplied, as it is, into a circuit arranged at a specific location where the internal ground voltage $VSSI_{REG}$ is 0V. Also, the pass voltage VPASS of 6.87V might be supplied with a decrease of 0.01V into a circuit arranged at another location where the internal ground voltage $VSSI_{REG}$ is 0.01V (i.e., the pass voltage VPASS of 6.86V can be supplied). Depending on a location of the component 220 in the semiconductor device chip 200, the internal power voltage can be differently supplied because of different electrical loads occurring at different locations.

According to an embodiment, the voltage generating device described with reference to FIGS. 4A and 4B can be included in, or applicable to, the voltage supply circuit 170 in the memory device 150 described with reference to FIG. 2. For example, the voltage supply circuit 170 generates a read voltage Vrd having different levels of 6.86V or 6.87V instead of 7V and applies the read voltage Vrd to the memory blocks 152, 154, 156. Because the read voltage Vrd lower than a preset level is applied to the memory blocks 152, 154, 156, threshold voltages of non-volatile memory cells included in the memory blocks 152, 154, 156 can be recognized as being higher than actual threshold voltages. In this case, the number of error bits in data read from the non-volatile memory cells during a read operation performed by the memory device 150 can be increased, so that operation performance of the memory system 110 may deteriorate.

Figure 5A:
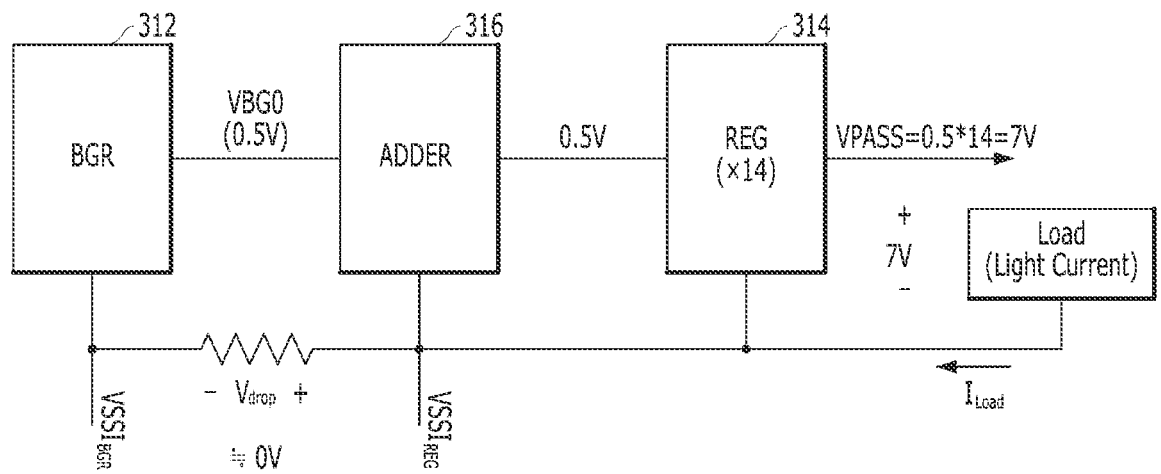
FIGS. 5A and 5B illustrate a voltage generating device according to an embodiment of the present disclosure.
Figure 5B:
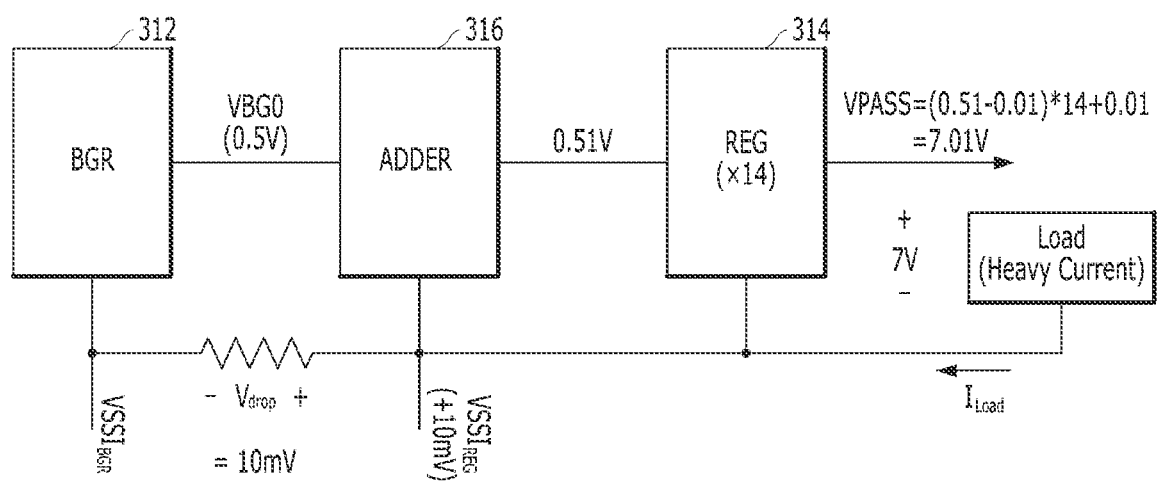

FIGS. 5A and 5B illustrate a voltage generating device according to an embodiment of the present disclosure.

Referring to FIGS. 5A and 5B, the voltage generating device according to an embodiment of the present invention may output the internal power voltage of various levels based on a sum of the reference voltage and the internal ground voltage. The voltage generating device may include an adder circuit 316 that adds a reference voltage and an internal ground voltage.

The voltage generating device can be configured to generate an internal power voltage or an internal operating voltage, having various levels, which is used in an operation performed by the component 220 included in the memory system 110 or the semiconductor device chip 200. The voltage generating device can include a band gap (BGR) circuit 312, an adder circuit 316, and a voltage generation circuit 314. Specifically, FIG. 5A describes the internal power voltage output from the voltage generating device when there is no change of the internal ground voltage. FIG. 5B describes the internal power voltage output from the voltage generating device when there is a change of the internal ground voltage.

Referring to FIG. 5A, when a current $I_{Load}$ flowing through a load in the semiconductor device does not deviate from a preset estimated range ("Light Current"), the internal ground voltage $VSSI_{REG}$, $VSSI_{BGR}$ applied to the voltage generating device might be not changed or fluctuated by the current $I_{Load}$ flowing through the load. The band gap reference (BGR) circuit 312 may generate a reference voltage VBG0 independent from a change of the process, the voltage, or the temperature (PVT). The adder circuit 316 may output a sum of the reference voltage VBG0 and the internal ground voltage $VSSI_{REG}$. The voltage generation circuit 314 may output the pass voltage VPASS in response to the sum of the reference voltage VBG0 and the internal ground voltage $VSSI_{REG}$. The pass voltage VPASS may be determined based on a relative voltage level difference from the internal ground voltage $VSSI_{REG}$.

The band gap reference (BGR) circuit 312 may output a reference voltage VBG0 of 0.5V independent from the change of the process, the voltage, or the temperature (PVT). Because the internal ground voltage $VSSI_{REG}$ is maintained as 0V without a fluctuation, the adder circuit 316 can output a sum of 0.5V, which is the sum of the reference voltage of 0.5V and the internal grounding voltage $VSSI_{REG}$ of 0V. The voltage generating circuit 314 can output the pass voltage VPASS of 7V, which is 14 times the reference voltage VBG0 of 0.5V. When the internal ground voltage $VSSI_{REG}$ is not changed or fluctuated from 0V, the pass voltage VPASS of 7V can be generated and supplied into the component 220 included in the semiconductor device chip 200. The component 220 included in the semiconductor device chip 200 may use the pass voltage VPASS of 7V to perform an operation.

Referring to FIG. 5B, when the current $I_{Load}$ flowing through the load in the semiconductor device deviates from the preset estimated range ("Heavy Current"), the internal ground voltage $VSSI_{REG}$, $VSSI_{BGR}$ applied to the voltage generating device might be changed by the current $I_{Load}$ flowing through the load. For example, the internal ground voltage $VSSI_{REG}$ is changed to 0.01V (10 mV) from 0V. The bandgap reference (BGR) circuit 312 can output the reference voltage VBG0 independent from the change of the process, the voltage, or the temperature (PVT). The pass voltage VPASS output by the voltage generation circuit 314 receiving the reference voltage VBG0 can be determined based on a relative voltage level difference from the internal ground voltage $VSSI_R G$.

The bandgap reference (BGR) circuit 312 can output a reference voltage VBG0 of 0.5V independent of the change of the process, the voltage, or the temperature (PVT). Because the internal ground voltage $VSSI_{REG}$ is changed to 0.01V, the adder circuit 316 may output a sum of 0.51V, which is the sum of the reference voltage of 0.5V and the internal grounding voltage $VSSI_{REG}$ of 0.01V.

The voltage generating circuit 314 can generate the pass voltage VPASS based on a voltage difference of 0.5V, which is a difference between the sum (i.e., 0.51 V) of the reference voltage VBG0 and the internal ground voltage $VSSI_{REG}$ and the internal ground voltage $VSSI_{REG}$ of 0.01 V. For example, the pass voltage VPASS of 7V, which is 14 times 0.5V, can be generated based on the internal ground voltage $VSSI_{RE}$ of 0.01V, so that the pass voltage VPASS of 7.01V may be output from the voltage generating device. A case when the current $I_{Load}$ flowing through the load in the semiconductor device deviates from the preset estimated range ("Heavy Current") can often occur sectionally, not entirely, in the semiconductor device chip 200. When the pass voltage VPASS of 7.01V is supplied into the component 220 included in the semiconductor device chip 200, the pass voltage of 7.01V can be supplied, as it is, into a circuit arranged at a specific location where the internal ground voltage $VSSI_{RE}$ is 0V. Also, the pass voltage of 7.01V might be supplied with a decrease of 0.01V into a circuit arranged at another location where the internal ground voltage $VSSI_{REG}$ is 0.01V (i.e., the pass voltage VPASS of 7V can be supplied). Even though the internal power voltage can be differently supplied depending on a location of the component 220 in the semiconductor device chip 200, a level difference between the internal power voltages (e.g., 7V, 7.01V) supplied at different locations can decrease.

According to an embodiment, the voltage generating device described with reference to FIGS. 5A and 5B may be included in the voltage supply circuit 170 in the memory device 150 described with reference to FIG. 2. A read voltage Vrd of 7V or 7.01V generated by the voltage supply circuit 170 may be applied to the memory blocks 152, 154, 156. Practically, the read voltage Vrd of 7.01V might not be significantly different from a preset level 7V of the read voltage Vrd. Because the read voltage Vrd having a level substantially equal to the preset level is applied to the memory blocks 152, 154, 156, the read operation may be performed normally (e.g., as expected) by the memory device 150. According to an embodiment, the voltage generating device described with reference to FIGS. 5A and 5B may generate the read voltage Vrd as well as a program voltage Vprog, a pass voltage Vpass, and an erase voltage Vers, which are selectively applied to the memory blocks 152, 154, 156.

Figure 6:
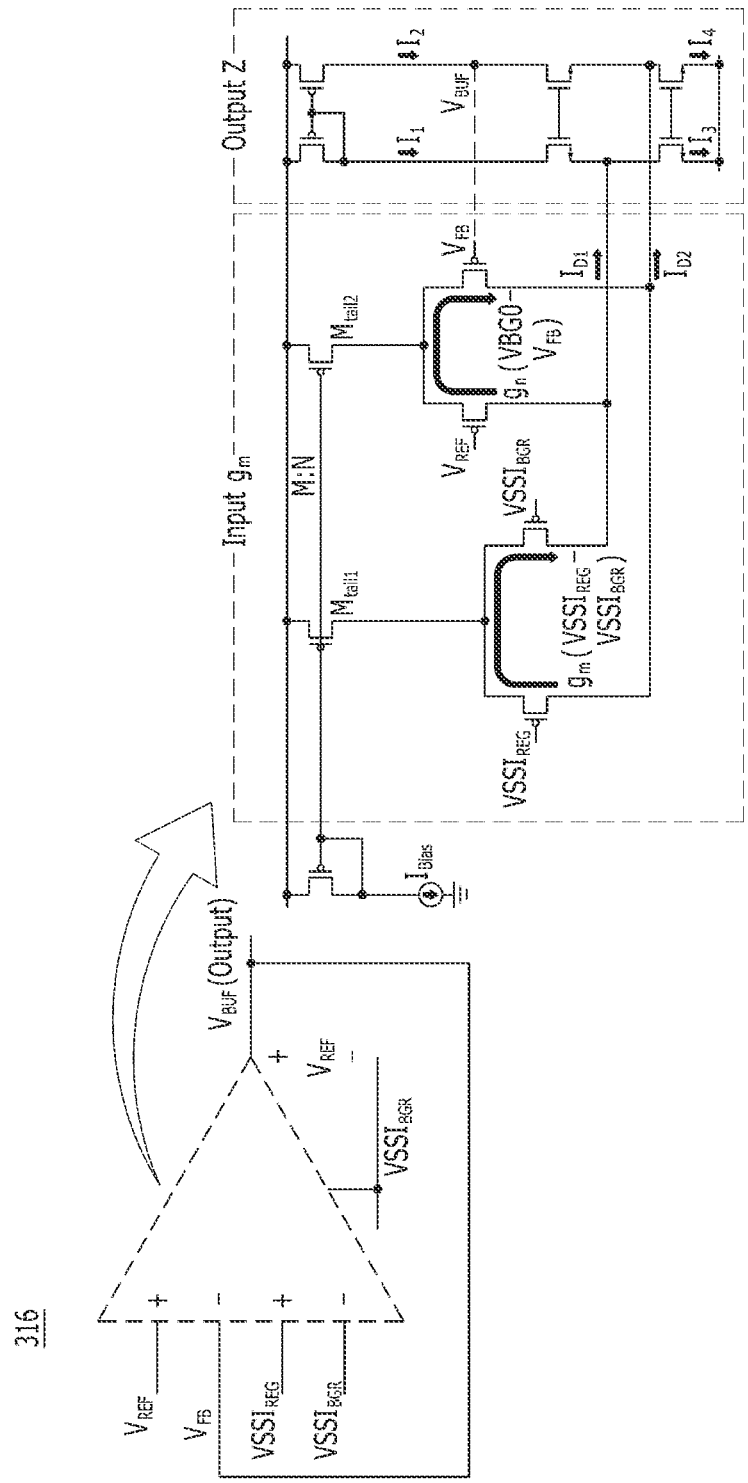
FIG. 6 illustrates an operation of an adder circuit according to an embodiment of the present disclosure.

FIG. 6 illustrates an operation of the adder circuit according to an embodiment of the present disclosure.

Referring to FIG. 6, the adder circuit 316 can receive the reference voltage $V_{REF}$, a feedback voltage $V_{FB}$, the reference ground voltage $VSSI_{BGR}$, and the internal ground voltage $VSSI_{REG}$, and output a result voltage $V_{BUF}$ having a level corresponding to the sum of the reference voltage $V_{REF}$ and the internal ground voltages $VSSI_{REG}$. The adder circuit 316 can track a variation of the internal ground voltage $VSSI_{REG}$. The adder circuit 316 can be configured differently based on how much to compensate for the variation of the internal ground voltage $VSSI_{REG}$. For example, a voltage level difference between the result voltage $V_{BUF}$ and the internal ground voltage $VSSI_{REG}$ can be recognized by the voltage generation circuit 314 described with reference to FIGS. 5A and 5B.

Specifically, the adder circuit 316 can include an input circuit ("Input gm") and an output circuit ("Output Z"). The input circuit ("Input gm") is configured to generate a first current $I_{D1}$ corresponding to a value of multiplying a first difference ($V_{REF}-V_{FB}$, $VBG0-V_{FB}$) between the reference voltage $V_{REF}$ output from the band gap reference circuit 312 and the feedback voltage $V_{FB}$ by a first gain gn and a second current $I_{D2}$ corresponding to another value of multiplying a second difference ($VSSI_{REG}-VSSI_{BGR}$) between the internal ground voltage $VSSI_{REG}$ and a reference ground voltage $VSSI_{BGR}$ by a second gain gm. The output circuit ("Output Z") can be configured to output the result voltage $V_{BUF}$ as an output of the adder circuit 316, in response to the first current $I_{D1}$ and the second current $I_{D2}$.

In the output circuit ("Output Z"), currents flowing through two current paths may be the substantially same. This can be understood as the following Equation 1.

$$I_1=I_2 \text{ \& } I_3=I_4 \qquad \text{(Equation 1)}$$

Based on the Equation 1, the following Equation 2 showing that amounts of the first current $I_{D1}$ and the second current $I_{D2}$ are also the same can be obtained.

$$I_{D1}=I_{D2} \text{ \& } I_{D1}-I_{D2}=0 \qquad \text{(Equation 2)}$$

Accordingly, the first current $I_{D1}$ and the second current $I_{D2}$ can be specifically expressed as in the following Equation 3.

$$I_{D1}-I_{D2}=g_n(V_{REF}-V_{FB})+g_m(VSSI_{REG}-VSSI_{BGR})=0 \quad \text{(Equation 3)}$$

According to an embodiment, the first gain gn and the second gain gm may be set to be the same. Based on the Equation 3, the feedback voltage $V_{FB}$ can be defined as the following Equations 4 and 5.

$$V_{REF}-V_{FB}=-(VSSI_{REG}-VSSI_{BGR}) \quad \text{(Equation 4)}$$

$$V_{FB}=VSSI_{REG}+(VBG0-VSSI_{BGR}) \quad \text{(Equation 5)}$$

In the Equation 5, the reference voltages $V_{REF}$, VBG0 and the reference ground voltage $VSSI_{BGR}$ output from the bandgap reference circuit 312 have independent values from the change of the process, the voltage, and the temperature (PVT variations) (see FIGS. 4A to 5B).

Therefore, the following Equation 6 can be obtained.

$$V_{FB}=VSSI_{REG}+500 \text{ mV} \quad \text{(Equation 6)}$$

This shows that, through the adder circuit 316, the feedback voltage $V_{FB}$ can be changed in response to the change of the internal ground voltage $VSSI_{REG}$. Accordingly, the voltage generating device including the adder circuit 316 can track a change of the internal ground voltage $VSSI_{REG}$ to generate an internal power voltage VCCI.

According to an embodiment, the adder circuit 316 may adjust a compensation degree corresponding to the change of the internal ground voltage $VSSI_{REG}$. This may be achieved by adjusting a ratio ("M:N") between the amounts of the current flowing through transistors $M_{tail1}$ and $M_{tail2}$ located in each of the two current paths in the input circuit ("Input gm"). For example, the first gain gn and the second gain gm may be substantially the same. In another embodiment, the compensation degree can be adjusted to be over-compensated or under-compensated according to the ratio ("M:N"). For example, if the second gain gm is adjusted to be greater than the first gain gn, the adder circuit 316 may overcompensate for the change of the internal ground voltage $VSSI_{REG}$. Conversely, if the first gain gn is adjusted to be greater than the second gain gm, the adder circuit 316 may undercompensate for the change of the internal ground voltage $VSSI_{REG}$. Herein, the compensation degree may be set differently based on the component 220 or an internal structure/design and operation characteristics of the memory system 110 or the semiconductor device chip 200.

Figure 7:
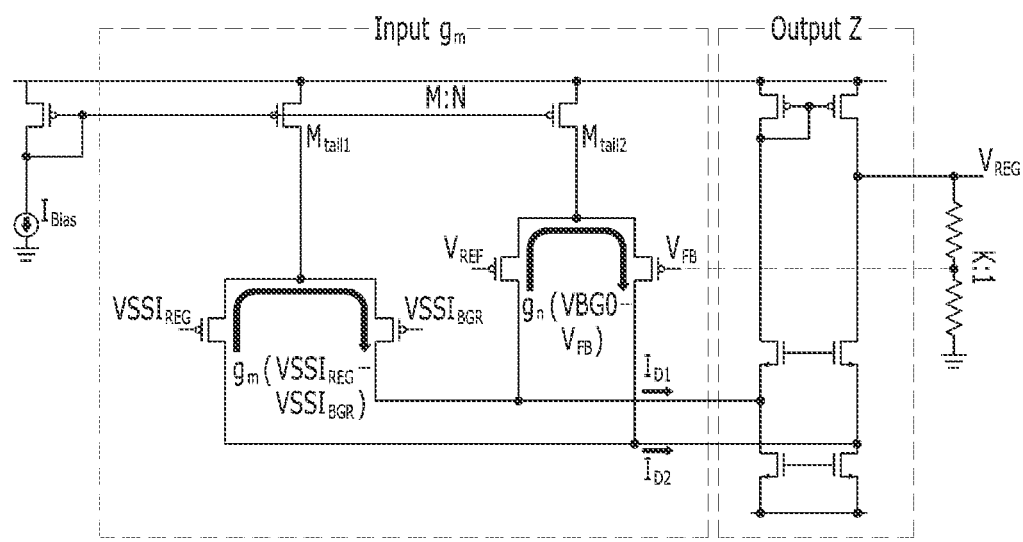
FIG. 7 illustrates a power generating device according to another embodiment of the present disclosure.

FIG. 7 illustrates a power generating device according to another embodiment of the present disclosure.

A power generating device 320 shown in FIG. 7 can have a structure in which the feedback circuit 416 described in FIG. 3 is coupled to the adder circuit 316 described in FIG. 6. According to an embodiment, according to characteristics of the internal power voltage output from the power generating device 320, a voltage generation circuit for generating a boosted voltage from an input voltage can be omitted in the power generating device 320. In another embodiment, the adder circuit 316 can be substituted for a voltage generation circuit. Further, in another embodiment, the adder circuit 316 and the voltage generation circuit 314 shown in FIGS. 5A and 5B can be combined in the power generating device 320. The detailed configuration of the power generating device 320 may be changed according to the characteristics of the internal power voltage.

Figure 8:
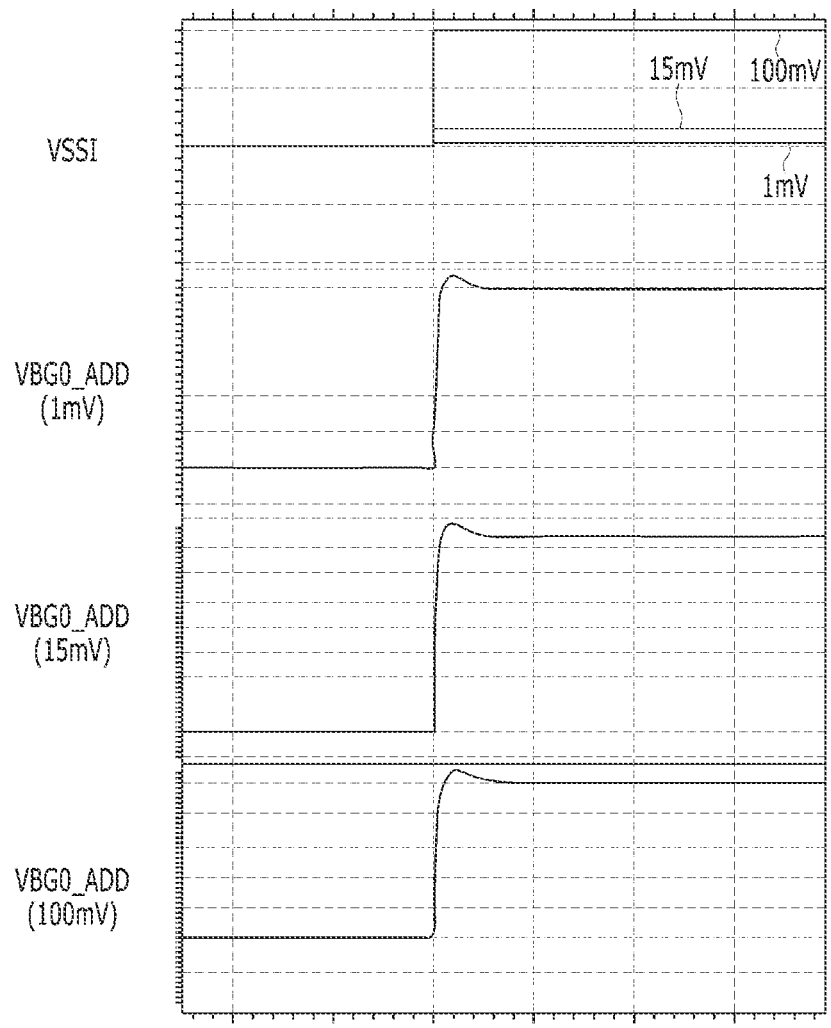
FIG. 8 illustrates an output of a voltage generating device based on a change of an internal ground voltage according to an embodiment of the present disclosure.

FIG. 8 illustrates an output of a voltage generating device based on the change of the internal ground voltage. FIG. 8 is a simulation test of showing whether a level of the internal power voltage VCCI output from the voltage generating device described with reference to FIGS. 5A and 5B can be stabilized when the internal ground voltage VSSI is changed or fluctuated with different levels. In FIG. 8, a horizontal axis may indicate time, and a vertical axis may indicate a voltage level.

Referring to FIG. 8, the internal ground voltage VSSI is increased by three different levels (e.g., 1 mV, 15 mV, and 100 mV) at a specific time. Referring to the output of the adder circuit 316 corresponding to the change of the internal ground voltage VSSI, the output rises for a very short time but is immediately stabilized.

For example, in the simulation test, a time required for output stabilization of the adder circuit 316 may be about 30 ns or less, and an overshooting magnitude may be about 0.35 mV or less. Further, the time spent on stabilizing the output of the adder circuit 316 is substantially the same regardless of the different changed levels of the internal ground voltage VSSI. This result may affect operating performance of the voltage generating device. Further, this result may be used for setting a margin or a window for a specific operation when the internal power voltage is applied to the component 220.

A semiconductor device according to an embodiment of the present invention can stably generate and provide an internal power voltage in response to a change of an internal ground voltage even if the internal ground voltage is changed or fluctuated due to excessive loads or an overcurrent that may occur due to a design, a structure, or an operation of a semiconductor chip. Accordingly, operational safety of the semiconductor device may be improved.

Further, the semiconductor device according to an embodiment of the present invention may track a change of the internal ground voltage and generate an internal power voltage corresponding to the sum of the internal ground voltage and a reference voltage, to compensate for the change of the internal ground voltage.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A power generation device, comprising:
    a band gap reference (BGR) circuit configured to generate a reference voltage independent of an environmental change;
    a voltage generation circuit configured to transfer an input power voltage in response to an output of an adder circuit to generate an internal power voltage; and
    the adder circuit configured to output an output voltage based on a first difference between the reference voltage and a feedback voltage corresponding to the internal power voltage and a second difference between an internal ground voltage and a reference ground voltage.

2. The power generation device according to claim 1, wherein the voltage generation circuit comprises:
    at least one of a pass circuit configured to transfer the input power voltage in response to the output of the adder circuit to output the internal power voltage or a regulator configured to change a level of the input power voltage in response to the output of the adder circuit to output the internal power voltage.

3. The power generation device according to claim 2, wherein the voltage generation circuit further comprises a feedback circuit configured to divide an output of the pass circuit or the regulator by a preset ratio to generate the feedback voltage.

4. The power generation device according to claim 3, wherein the adder circuit comprises:
   an input circuit configured to generate a first current corresponding to a value of multiplying the first difference by a first gain and a second current corresponding to another value of multiplying the second difference by a second gain; and
   an output circuit configured to output the output voltage in response to the first current and the second current.

5. The power generation device according to claim 4, wherein the adder circuit is further configured to control a compensation degree for a change of the internal ground voltage based on a ratio of the first gain and the second gain.

6. The power generation device according to claim 1, wherein the voltage generation circuit comprises:
   a feedback circuit configured to divide an output of the adder circuit by a preset ratio to generate the feedback voltage.

7. The power generation device according to claim 6, wherein the adder circuit comprises:
   an input circuit configured to generate a first current corresponding to a value of multiplying the first difference by a first gain, and a second current corresponding to another value of multiplying the second difference by a second gain; and
   an output circuit configured to output the output voltage in response to the first current and the second current.

8. The power generation device according to claim 7, wherein the adder circuit is further configured to control a compensation degree for a change of the internal ground voltage based on a ratio of the first gain and the second gain.

9. A power circuit, comprising:
   a voltage sensor configured to sense an internal ground voltage;
   a power generation device configured to transfer an input power voltage in response to an output of an adder circuit to generate an internal power voltage; and
   the adder circuit configured to output an output voltage based on a first difference between a reference voltage, which is independent of an environmental change, and a feedback voltage corresponding to the internal power voltage and a second difference between the internal ground voltage and a reference ground voltage.

10. The power circuit according to claim 9, wherein the power generation device comprises:
    a band gap reference (BGR) circuit configured to generate the reference voltage; and
    a voltage generation circuit configured to transfer the input power voltage based on the sum of the reference voltage and the internal ground voltage to generate the internal power voltage.

11. The power circuit according to claim 10, wherein the voltage generation circuit comprises:
    at least one of a pass circuit configured to transfer the input power voltage in response to the output of the adder circuit to output the internal power voltage or a regulator configured to change a level of the input power voltage in response to the output of the adder circuit to output the internal power voltage.

12. The power circuit according to claim 11, wherein the voltage generation circuit further comprises a feedback circuit configured to divide an output of the pass circuit or the regulator by a preset ratio to generate the feedback voltage.

13. The power circuit according to claim 12, wherein the adder circuit comprises:
    an input circuit configured to generate a first current corresponding to a value of multiplying the first difference by a first gain, and a second current corresponding to another value of multiplying the second difference by a second gain; and
    an output circuit configured to output the output voltage in response to the first current and the second current.

14. The power circuit according to claim 13, wherein the adder circuit is further configured to control a compensation degree for a change of the internal ground voltage based on a ratio of the first gain and the second gain.

15. The power circuit according to claim 10, wherein the voltage generation circuit comprises:
    a feedback circuit configured to divide an output of the adder circuit by a preset ratio to generate the feedback voltage.

16. The power circuit according to claim 15, wherein the adder circuit comprises:
    an input circuit configured to generate a first current corresponding to a value of multiplying the first difference by a first gain, and a second current corresponding to another value of multiplying the second difference by a second gain; and
    an output circuit configured to output the output voltage in response to the first current and the second current.

17. The power circuit according to claim 16, wherein the adder circuit is further configured to control a compensation degree for a change of the internal ground voltage based on a ratio of the first gain and the second gain.

18. A semiconductor device, comprising:
    a pin or a pad;
    an internal circuit;
    a voltage generating device which is coupled to the pin, or the pad, and the internal circuit and configured to transfer an input power voltage in response to an output of an adder circuit to generate an internal power voltage; and
    the adder circuit configured to output an output voltage based on a first difference between a reference voltage, which is independent of an environmental change, and a feedback voltage corresponding to the internal power voltage and a second difference between the internal ground voltage and a reference ground voltage.

19. The semiconductor device according to claim 18, wherein the voltage generating device comprises:
    a band gap reference (BGR) circuit configured to generate the reference voltage; and
    a voltage generator configured to transfer the input power voltage based on the sum of the reference voltage and the internal ground voltage to generate the internal power voltage.

20. The semiconductor device according to claim 19, wherein the voltage generator comprises:
    at least one of a pass circuit configured to transfer the input power voltage in response to the output of the adder circuit to output the internal power voltage or a regulator configured to change a level of the input power voltage in response to the output of the adder circuit to output the internal power voltage; and a feedback circuit configured to divide an output of the pass circuit or the regulator by a preset ratio to generate the feedback voltage.

\* \* \* \* \*